(12) United States Patent
Huang et al.

(10) Patent No.: US 11,728,194 B2
(45) Date of Patent: Aug. 15, 2023

(54) WAFER HANDLING APPARATUS AND METHOD OF OPERATING THE SAME

(71) Applicant: NANYA TECHNOLOGY CORPORATION, New Taipei (TW)

(72) Inventors: Jih-Cheng Huang, Taoyuan (TW); Meng-Liang Wei, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/643,173

(22) Filed: Dec. 7, 2021

(65) Prior Publication Data
US 2023/0178403 A1 Jun. 8, 2023

(51) Int. Cl.
*H01L 21/677* (2006.01)
*H04N 23/57* (2023.01)

(52) U.S. Cl.
CPC .. *H01L 21/67775* (2013.01); *H01L 21/67766* (2013.01); *H04N 23/57* (2023.01)

(58) Field of Classification Search
CPC ......... H01L 21/67775; H01L 21/67766; H01L 21/67778; H01L 21/67763; H01L 21/67772; H01L 21/67796; H01L 21/681; H04N 5/2257
See application file for complete search history.

(56) References Cited

U.S. PATENT DOCUMENTS

| | | | | |
|---|---|---|---|---|
| 6,082,951 A | * | 7/2000 | Nering | H01L 21/67772 414/416.03 |
| 2002/0103571 A1 | * | 8/2002 | Yoo | H01L 21/67796 700/228 |
| 2011/0158774 A1 | * | 6/2011 | Yamaguchi | H01L 21/67265 414/222.02 |
| 2018/0061692 A1 | * | 3/2018 | Nishino | G05B 19/41865 |
| 2020/0073258 A1 | * | 3/2020 | Chiu | G03F 7/70725 |
| 2021/0407838 A1 | * | 12/2021 | Garssen | H01L 21/67775 |

* cited by examiner

*Primary Examiner* — Glenn F Myers
(74) *Attorney, Agent, or Firm* — CKC & Partners Co., LLC

(57) ABSTRACT

A wafer handling apparatus includes at least one load port, an image capturing device and a processor. The load port is configured to receive a wafer carrier. The image capturing device is configured to capture an image of the wafer carrier received in the load port before one or more wafers are inserted into the wafer carrier. The processor is communicably connected to the image capturing device and is configured to determine whether the wafer carrier is in a condition that is unsafe for wafer placement based on the image captured by the image capturing device.

14 Claims, 5 Drawing Sheets

WAFER HANDLING APPARATUS AND METHOD OF OPERATING THE SAME

BACKGROUND

Technical Field

The present disclosure relates to a wafer handling apparatus and method of operating the same.

Description of Related Art

FOUP and FOSB are standard containers for storing wafers. When inserting wafers into a FOUP/FOSB, it is important to ensure that the FOUP/FOSB would not cause damage to the wafers.

SUMMARY

In view of the foregoing, one of the objects of the present disclosure is to provide a wafer handling apparatus that can inspect the wafer carrier loaded thereon to detect any potential issues with the wafer carrier.

To achieve the objective stated above, in accordance with some embodiments of the present disclosure, a wafer handling apparatus includes at least one load port, an image capturing device and a processor. The load port is configured to receive a wafer carrier. The image capturing device is configured to capture an image of the wafer carrier received in the load port before one or more wafers are inserted into the wafer carrier. The processor is communicably connected to the image capturing device and is configured to determine whether the wafer carrier is in a condition that is unsafe for wafer placement based on the image captured by the image capturing device.

In one or more embodiments of the present disclosure, the wafer handling apparatus further includes a robotic arm. The processor is further configured to provide a control signal if it is determined that the wafer carrier is in the condition that is unsafe for wafer placement. The control signal causes the robotic arm to stop inserting the one or more wafers into the wafer carrier.

In one or more embodiments of the present disclosure, the wafer handling apparatus further includes an alarm system. The control signal further causes the alarm system to issue an alarm.

In one or more embodiments of the present disclosure, the wafer handling apparatus further includes a robotic arm. The processor is further configured to provide a control signal if it is determined that the wafer carrier is not in the condition that is unsafe for wafer placement. The control signal causes the robotic arm to insert the one or more wafers into the wafer carrier.

In one or more embodiments of the present disclosure, the image capturing device is configured to capture the image of the wafer carrier after a door of the wafer carrier is removed.

In one or more embodiments of the present disclosure, the image capturing device is fixedly mounted in front of the load port.

In one or more embodiments of the present disclosure, the wafer handling apparatus further includes a robotic arm. The image capturing device is disposed on the robotic arm. The robotic arm is configured to move the image capturing device to face the load port.

In one or more embodiments of the present disclosure, the processor is configured to detect whether the wafer carrier has improperly installed components inside, structural damage or deformation based on the image, and if it is detected that the wafer carrier has improperly installed components inside, structural damage or deformation, the processor determines that the wafer carrier is in the condition that is unsafe for wafer placement.

In accordance with some embodiments of the present disclosure, a method of operating a wafer handling apparatus includes: receiving, by a load port of the wafer handling apparatus, a wafer carrier; before one or more wafers are inserted into the wafer carrier, capturing, by an image capturing device of the wafer handling apparatus, an image of the wafer carrier; and determining, by a processor of the wafer handling apparatus, whether the wafer carrier is in a condition that is unsafe for wafer placement based on the image.

In one or more embodiments of the present disclosure, the method further includes: stopping a robotic arm of the wafer handling apparatus from inserting the one or more wafers into the wafer carrier if it is determined that the wafer carrier is in the condition that is unsafe for wafer placement.

In one or more embodiments of the present disclosure, the method further includes: issuing, by an alarm system of the wafer handling apparatus, an alarm if it is determined that the wafer carrier is in the condition that is unsafe for wafer placement.

In one or more embodiments of the present disclosure, the method further includes: inserting, by a robotic arm of the wafer handling apparatus, the one or more wafers into the wafer carrier if it is determined that the wafer carrier is not in the condition that is unsafe for wafer placement.

In one or more embodiments of the present disclosure, the image of the wafer carrier is captured by the image capturing device after a door of the wafer carrier is removed.

In one or more embodiments of the present disclosure, the method further includes: moving, by a robotic arm of the wafer handling apparatus, the image capturing device to face the load port.

In one or more embodiments of the present disclosure, the step of determining whether the wafer carrier is in the condition that is unsafe for wafer placement includes: detecting whether the wafer carrier has improperly installed components inside, structural damage or deformation based on the image; and if it is detected that the wafer carrier has improperly installed components inside, structural damage or deformation, determining that the wafer carrier is in the condition that is unsafe for wafer placement.

In sum, the wafer handling apparatus of the present disclosure includes an image capturing device configured to capture an image of a wafer carrier received in the load port before one or more wafers are inserted into the wafer carrier. Based on the image, a processor of the wafer handling apparatus can determine whether the wafer carrier is in a condition that is unsafe for wafer placement. By this arrangement, any wafer carrier having defect can be identified to avoid causing damage to the wafers.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
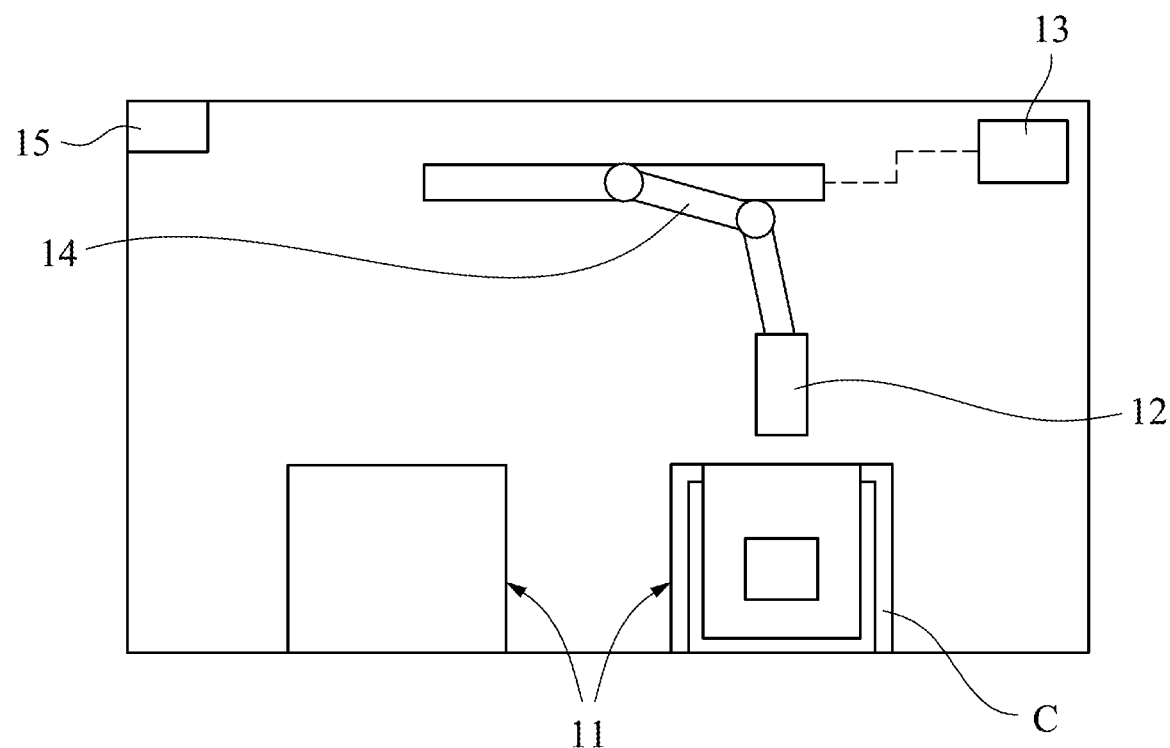
FIG. 1 illustrates a schematic top view of a wafer handling apparatus in accordance with an embodiment of the present disclosure.

Reference will now be made in detail to the present embodiments of the present disclosure, examples of which are illustrated in the accompanying drawings. Wherever possible, the same reference numerals are used in the drawings and the description to refer to the same or like parts.

Figure 2:
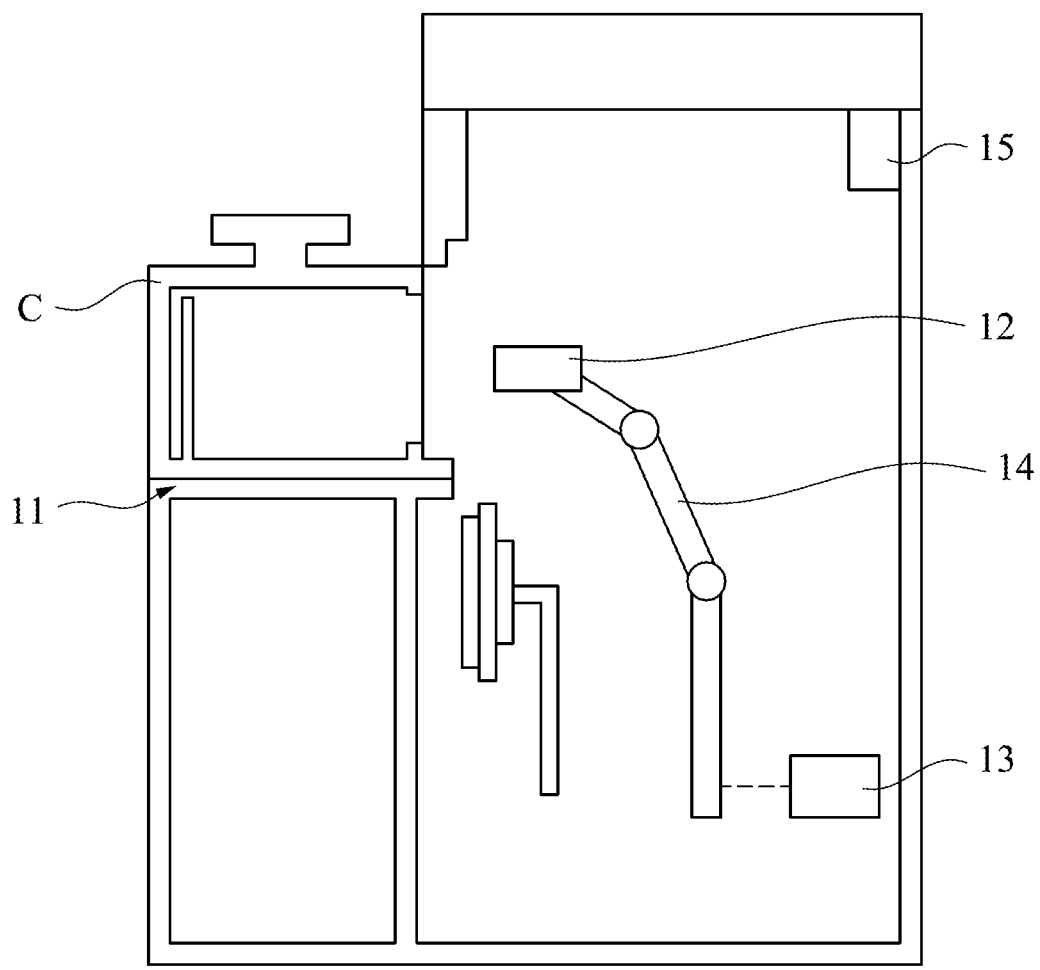
FIG. 2 illustrates a schematic side view of the wafer handling apparatus shown in FIG. 1.

Reference is made to FIGS. 1 and 2. FIG. 1 illustrates a schematic top view of a wafer handling apparatus 10 in accordance with an embodiment of the present disclosure. FIG. 2 illustrates a schematic side view of the wafer handling apparatus 10 shown in FIG. 1. The wafer handling apparatus 10 may be a wafer sorter or any kind of wafer processing equipment. The wafer handling apparatus 10 includes at least one load port 11. The load port 11 is configured to receive a wafer carrier C, which may be a FOUP (front opening unified pod) or a FOSB (front opening shipping box). In the illustrated embodiment, the wafer handling apparatus 10 includes a plurality of load ports 11. Each of the load ports 11 can receive a wafer carrier C.

As shown in FIGS. 1 and 2, the wafer handling apparatus 10 further includes at least one image capturing device 12 (e.g., a camera). The image capturing device 12 is configured to capture an image of the wafer carrier C received in the load port 11 before one or more wafers are inserted into the wafer carrier C. In some embodiments, the image capturing device 12 is configured to capture an image of the interior of the wafer carrier C (e.g., the internal space for holding wafers). In some embodiments, the wafer carrier C includes a box and a door. The box has an opening. The door is configured to cover the opening of the box. The image capturing device 12 is configured to capture an image of the wafer carrier C after the door of the wafer carrier C is removed.

As shown in FIGS. 1 and 2, the wafer handling apparatus 10 further includes a processor 13. The processor 13 is communicably connected to the image capturing device 12 and is configured to receive the image of the wafer carrier C from the image capturing device 12. The processor 13 may be connected to the image capturing device 12 via a wired connection or a wireless connection. The processor 13 is further configured to determine whether the wafer carrier C is in a condition that is unsafe for wafer placement (in other words, a condition that could damage wafer) based on the image captured by the image capturing device 12, before one or more wafers are inserted into the wafer carrier C. By this arrangement, any wafer carrier having defect can be identified to avoid causing damage to the wafers.

In some embodiments, the processor 13 of the wafer handling apparatus 10 is configured to detect whether the wafer carrier C has improperly installed components inside (e.g., a wafer support, a diffuser for purging, or other components may be offset from its normal position inside the wafer carrier C, which could cause damage to the wafers), structural damage or deformation based on the image of the wafer carrier C. If it is detected that the wafer carrier C has improperly installed components inside, structural damage or deformation, then the processor 13 makes a determination that the wafer carrier C is in a condition that is unsafe for wafer placement. Otherwise, the processor 13 makes a determination that the wafer carrier C is not in a condition that is unsafe for wafer placement.

As shown in FIGS. 1 and 2, in some embodiments, the wafer handling apparatus 10 further includes a robotic arm 14 for moving wafers. In some embodiments, the robotic arm 14 may include a plurality of arm links connected by one or more mechanical joints, which allows rotational or translational motion between the arm links. The robotic arm 14 may also include mechanisms for holding wafers, which is not depicted in the drawings. In some embodiments, the wafer handling apparatus 10 further includes an alarm system 15 communicably connected to the processor 13.

As shown in FIGS. 1 and 2, in some embodiments, the processor 13 of the wafer handling apparatus 10 is further configured to provide a first control signal if it is determined that the wafer carrier C is in a condition that is unsafe for wafer placement. The first control signal causes the robotic arm 14 to stop inserting the one or more wafers into the wafer carrier C. In some embodiments, the first control signal further causes the alarm system 15 to issue an alarm, such that the related personnel can be notified.

In some embodiments, the processor 13 of the wafer handling apparatus 10 is further configured to provide a second control signal if it is determined that the wafer carrier C is not in a condition that is unsafe for wafer placement. The second control signal causes the robotic arm 14 to insert the one or more wafers into the wafer carrier C.

In some embodiments, the processor 13 of the wafer handling apparatus 10 is configured to determine whether the wafer carrier C is in a condition that is unsafe for wafer placement by comparing the image captured by the image capturing device 12 to at least one reference image. The reference image may be an image of a wafer carrier that is known to be safe to put wafers into (i.e., not in a condition that is unsafe for wafer placement). By comparing the image captured by the image capturing device 12 to the reference image, potential abnormality with the wafer carrier C (e.g., the wafer carrier C may have components offset from its normal position, structural damage or deformation) can be identified.

If the processor 13 determines that the image captured by the image capturing device 12 is similar to the reference image, then the wafer carrier C is determined to be not in a condition that is unsafe for wafer placement. On the other hand, if the processor 13 determines that the image captured by the image capturing device 12 is not similar to the reference image, then the wafer carrier C is determined to be in a condition that is unsafe for wafer placement. In some embodiments, the reference image may be stored in a storage medium readable by the processor 13 (e.g., DRAM, a mechanical disk, a solid-state drive, or other types of storage medium as deemed appropriate).

In some embodiments, the processor 13 of the wafer handling apparatus 10 is configured to determine whether the wafer carrier C is in a condition that is unsafe for wafer placement using AI-based image recognition scheme. In some embodiments, the processor 13 is configured to use the image captured by the image capturing device 12 as an input to a function generated by running a machine learning algorithm on a training data set. The training data set may include multiple training examples. Each of the training example may include: (a) an image of a wafer carrier or one or more features derived from the image; and (b) the classification of the image or the features (e.g., whether the image or the features indicate that the wafer carrier in the image is in a condition that is unsafe for wafer placement, or is not in a condition that is unsafe for wafer placement). When the image captured by the image capturing device 12 is received as the input, the function provides an output of whether the wafer carrier C in the image is in a condition that is unsafe for wafer placement or is not in a condition that is unsafe for wafer placement. The processor 13 can make a determination regarding the condition of the wafer carrier C based on the output of the function.

In some embodiments, the function may be generated on an external computing hardware, and the processor 13 may receive the function from said external computing hardware. In other embodiments, the image captured by the image capturing device 12 may be transmitted to the external computing hardware. The external computing hardware applies the function to the image captured by the image capturing device 12 and transmits the output of the function to the processor 13.

As shown in FIGS. 1 and 2, in some embodiments, the image capturing device 12 of the wafer handling apparatus 10 is disposed on the robotic arm 14 for moving wafers. The robotic arm 14 can move the image capturing device 12 to face the load port 11 and capture an image of the wafer carrier C, and can readily insert the wafers into the wafer carrier C once the processor 13 makes a determination that the wafer carrier C is not in a condition that is unsafe for wafer placement. In embodiments where the wafer handling apparatus 10 includes multiple load ports 11, the robotic arm 14 may move the image capturing device 12 between the load ports 11.

Figure 3:
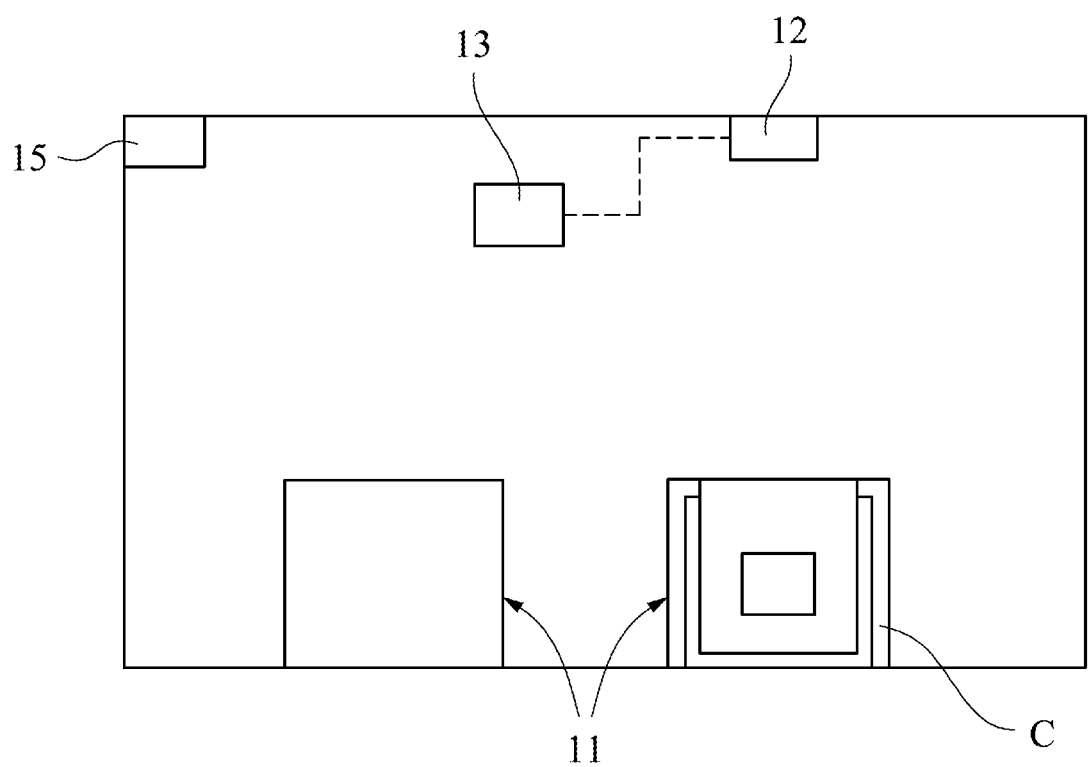
FIG. 3 illustrates a schematic top view of a wafer handling apparatus in accordance with another embodiment of the present disclosure.
Figure 4:
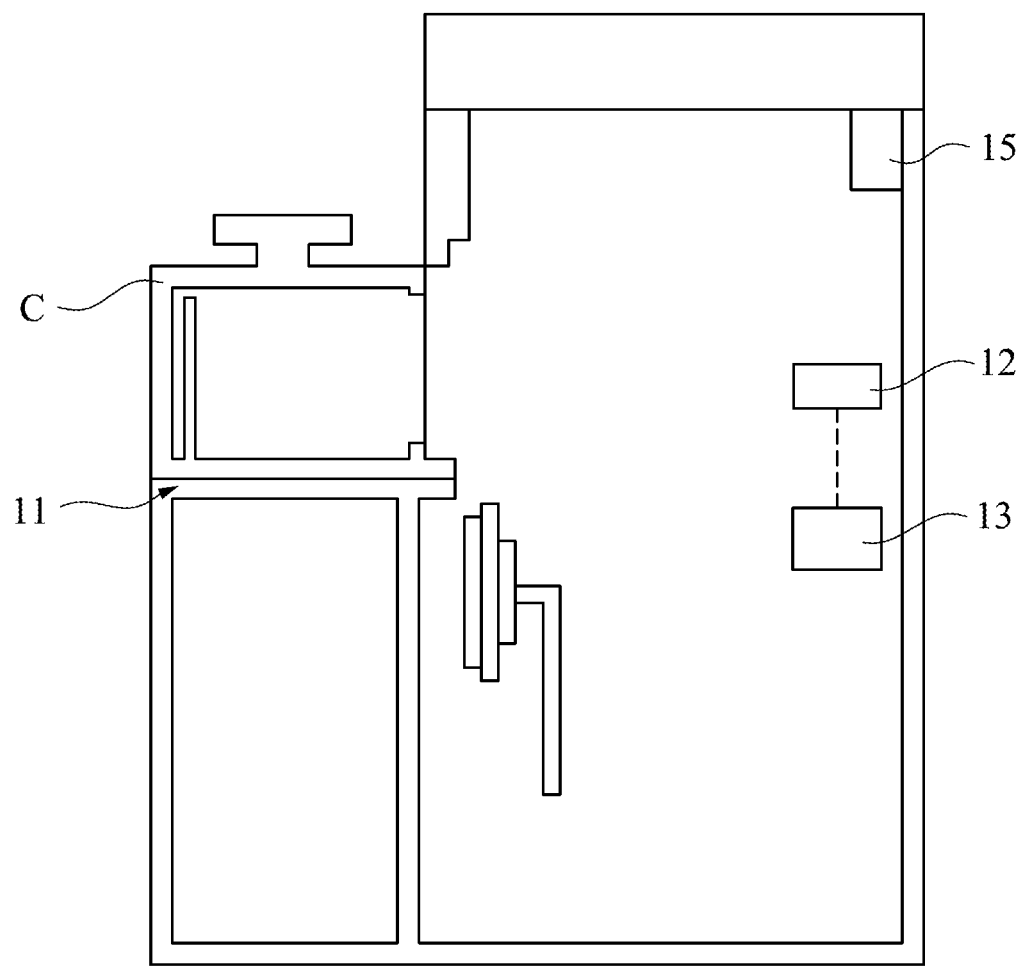
FIG. 4 illustrates a schematic side view of the wafer handling apparatus shown in FIG. 3.

Reference is made to FIGS. 3 and 4. FIG. 3 illustrates a schematic top view of a wafer handling apparatus 20 in accordance with another embodiment of the present disclosure. FIG. 4 illustrates a schematic side view of the wafer handling apparatus 20 shown in FIG. 3. The present embodiment differs from the embodiment shown in FIGS. 1 and 2 in that the image capturing device 12 of the wafer handling apparatus 20 is fixedly mounted in front of the load port 11 and is oriented towards the load port 11, such that the image capturing device 12 can capture an image of the wafer carrier C received in the load port 11 before one or more wafers are inserted into the wafer carrier C. In some embodiments, the image capturing device 12 is fixedly mounted on an inner wall of the wafer handling apparatus 20.

In embodiments where the wafer handling apparatus 20 includes a plurality of load ports 11, the wafer handling apparatus 20 may include a plurality of image capturing devices 12 each being mounted in front of one of the load ports 11 and being connected to the processor 13, so as to enable the processor 13 to inspect the wafer carrier received in any of the load ports 11.

In some embodiments, the wafer handling apparatus 20 further includes a robotic arm (not depicted) communicably connected to the processor 13 and configured to move wafers. The robotic arm of the wafer handling apparatus 20 is configured to move out of the space between the image capturing device 12 and the corresponding load port 11 when the image capturing device 12 is ready to capture an image of the wafer carrier C received in the load port 11.

Figure 5:
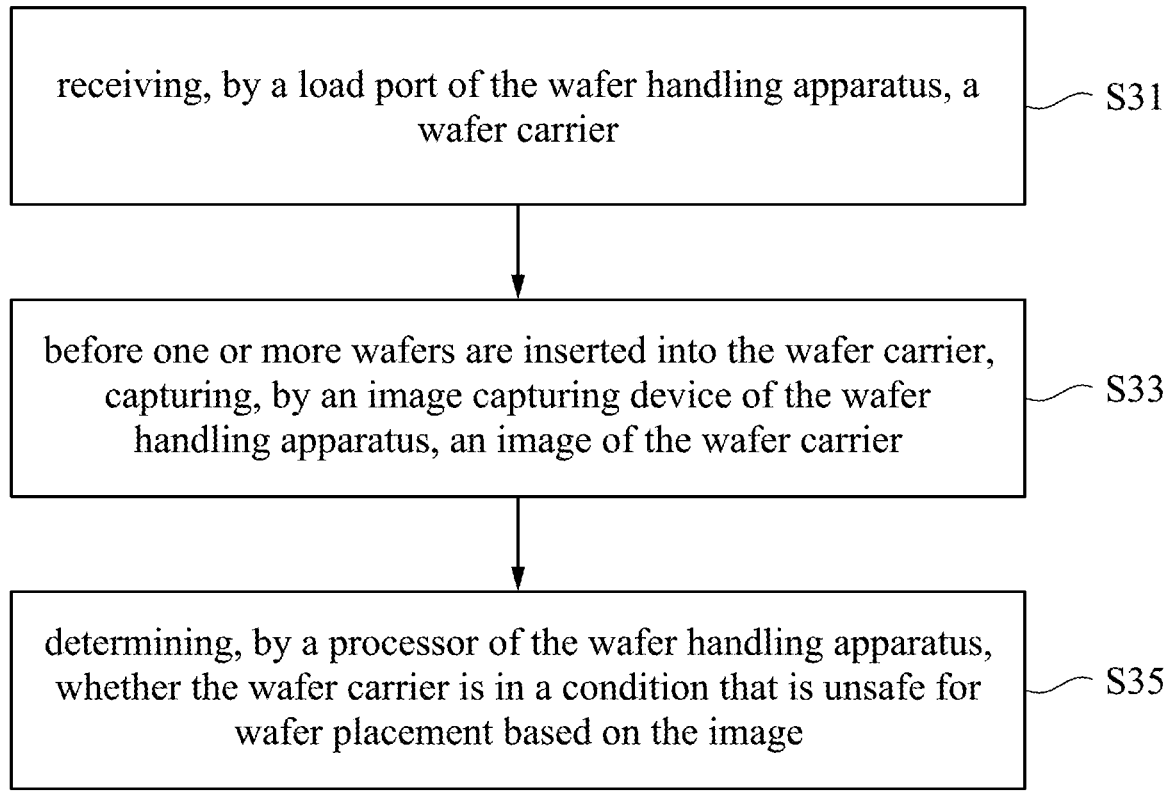
FIG. 5 illustrates a flowchart for a method of operating a wafer handling apparatus in accordance with an embodiment of the present disclosure.

Reference is made to FIG. 5, which illustrates a flowchart for a method 30 of operating a wafer handling apparatus (e.g., the wafer handling apparatus 10 or the wafer handling apparatus 20 discussed above) in accordance with an embodiment of the present disclosure. The method 30 includes steps S31, S33 and S35, which will be described in detail below with reference to FIGS. 1 to 4.

The method 30 commences at step S31, which includes: receiving, by a load port 11 of the wafer handling apparatus 10 or 20, a wafer carrier C (e.g., a FOUP or a FOSB).

Next, the method 30 continues to step S33, which includes: before one or more wafers are inserted into the wafer carrier C, capturing, by an image capturing device 12 of the wafer handling apparatus 10 or 20, an image of the wafer carrier C.

In some embodiments, step S33 includes: capturing, by the image capturing device 12, an image of the interior of the wafer carrier C. In some embodiments, step S33 includes: capturing, by the image capturing device 12, an image of the wafer carrier C after a door of the wafer carrier C is removed.

Next, the method 30 continues to step S35, which includes: determining, by a processor 13 of the wafer handling apparatus 10 or 20, whether the wafer carrier C is in a condition that is unsafe for wafer placement based on the image of the wafer carrier C.

In some embodiments, step S35 includes: (a) detecting whether the wafer carrier C has improperly installed components inside, structural damage or deformation based on the image captured by the image capturing device 12; (b) if it is detected that the wafer carrier C has improperly installed components inside, structural damage or deformation, then determining that the wafer carrier C is in a condition that is unsafe for wafer placement; and (c) otherwise, determining that the wafer carrier C is not in a condition that is unsafe for wafer placement.

In some embodiments, step S35 includes: (a) comparing the image captured by the image capturing device 12 to at least one reference image; (b) determining a similarity between the image captured by the image capturing device 12 and the reference image; (c) if the similarity between the image captured by the image capturing device 12 and the reference image is greater than or equal to a threshold value, then making a determination that the wafer carrier C is not in a condition that is unsafe for wafer placement; and (d) otherwise, making a determination that the wafer carrier C is in a condition that is unsafe for wafer placement.

In some embodiments, step S35 includes: determining whether the wafer carrier C is in a condition that is unsafe for wafer placement using AI-based image recognition scheme. In some embodiments, step S35 includes: (a) using the image captured by the image capturing device 12 as an input to a function generated by running a machine learning algorithm on a training data set; and (b) making a determination regarding the condition of the wafer carrier C based on the output of the function, wherein the output of the function indicates whether or not the wafer carrier C is in a condition that is unsafe for wafer placement.

In some embodiments, the method 30 further includes: stopping a robotic arm of the wafer handling apparatus 10 or 20 from inserting the one or more wafers into the wafer carrier C if it is determined in step S35 that the wafer carrier C is in a condition that is unsafe for wafer placement. In some embodiments, the method 30 further includes: issuing, by an alarm system 15 of the wafer handling apparatus 10 or 20, an alarm if it is determined in step S35 that the wafer carrier C is in a condition that is unsafe for wafer placement.

In some embodiments, the method 30 further includes: inserting, by a robotic arm 14 of the wafer handling apparatus 10 or 20, the one or more wafers into the wafer carrier C if it is determined in step S35 that the wafer carrier C is not in a condition that is unsafe for wafer placement.

In sum, the wafer handling apparatus of the present disclosure includes an image capturing device configured to capture an image of a wafer carrier received in the load port before one or more wafers are inserted into the wafer carrier. Based on the image, a processor of the wafer handling apparatus can determine whether the wafer carrier is in a condition that is unsafe for wafer placement. By this arrangement, any wafer carrier having defect can be identified to avoid causing damage to the wafers.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A wafer handling apparatus, comprising:
   at least one load port configured to receive a wafer carrier;
   an image capturing device configured to capture an image of the wafer carrier received in the at least one load port before one or more wafers are inserted into the wafer carrier;
   a processor communicably connected to the image capturing device and configured to determine whether the wafer carrier is in a condition that is unsafe for wafer placement based on the image captured by the image capturing device; and
   a robotic arm, wherein the processor is further configured to provide a first control signal if it is determined that the wafer carrier is in the condition that is unsafe for wafer placement based on the image captured by the image capturing device, wherein the first control signal causes the robotic arm to stop inserting the one or more wafers into the wafer carrier.

2. The wafer handling apparatus of claim 1, further comprising an alarm system, wherein the first control signal further causes the alarm system to issue an alarm.

3. The wafer handling apparatus of claim 1, wherein the processor is further configured to provide a second control signal if it is determined that the wafer carrier is not in the condition that is unsafe for wafer placement, wherein the second control signal causes the robotic arm to insert the one or more wafers into the wafer carrier.

4. The wafer handling apparatus of claim 1, wherein the image capturing device is configured to capture the image of the wafer carrier after a door of the wafer carrier is removed.

5. The wafer handling apparatus of claim 1, wherein the image capturing device is fixedly mounted in front of the at least one load port.

6. The wafer handling apparatus of claim 1, wherein the image capturing device is disposed on the robotic arm, and the robotic arm is configured to move the image capturing device to face the at least one load port.

7. The wafer handling apparatus of claim 1, wherein the processor is configured to detect whether the wafer carrier has improperly installed components inside, structural damage or deformation based on the image, and if it is detected that the wafer carrier has improperly installed components inside, structural damage or deformation, then the processor determines that the wafer carrier is in the condition that is unsafe for wafer placement.

8. A method of operating a wafer handling apparatus, comprising:
   receiving, by a load port of the wafer handling apparatus, a wafer carrier;
   before one or more wafers are inserted into the wafer carrier, capturing, by an image capturing device of the wafer handling apparatus, an image of the wafer carrier;
   determining, by a processor of the wafer handling apparatus, whether the wafer carrier is in a condition that is unsafe for wafer placement based on the image; and
   stopping a robotic arm of the wafer handling apparatus from inserting the one or more wafers into the wafer carrier if it is determined that the wafer carrier is in the condition that is unsafe for wafer placement based on the image captured by the image capturing device.

9. The method of claim 8, further comprising:
   issuing, by an alarm system of the wafer handling apparatus, an alarm if it is determined that the wafer carrier is in the condition that is unsafe for wafer placement.

10. The method of claim 8, further comprising:
    inserting, by the robotic arm of the wafer handling apparatus, the one or more wafers into the wafer carrier if it is determined that the wafer carrier is not in the condition that is unsafe for wafer placement.

11. The method of claim 8, wherein the image of the wafer carrier is captured by the image capturing device after a door of the wafer carrier is removed.

12. The method of claim 8, wherein the image capturing device is fixedly mounted in front of the load port.

13. The method of claim 8, further comprising:
    moving, by the robotic arm of the wafer handling apparatus, the image capturing device to face the load port.

14. The method of claim 8, wherein the determining whether the wafer carrier is in the condition that is unsafe for wafer placement comprises:
    detecting whether the wafer carrier has improperly installed components inside, structural damage or deformation based on the image; and
    if it is detected that the wafer carrier has improperly installed components inside, structural damage or deformation, then determining that the wafer carrier is in the condition that is unsafe for wafer placement.

* * * * *